United States Patent [19]

Anderson et al.

[11] Patent Number: 4,939,014
[45] Date of Patent: Jul. 3, 1990

[54] COMPOSITE POLYMER/DESICCANT COATINGS FOR IC ENCAPSULATION

[75] Inventors: James E. Anderson, Ann Arbor; Vlado Markovac, Lathrup Village, both of Mich.; Philip R. Troyk, Morton Grove, Ill.

[73] Assignee: Ford Motor Company, Dearborn, Mich.

[21] Appl. No.: 133,820

[22] Filed: Dec. 16, 1987

[51] Int. Cl.$^5$ .............................................. B32B 1/04
[52] U.S. Cl. .................................... 428/76; 428/209; 428/446; 428/447; 428/448; 428/450
[58] Field of Search ................. 428/76, 901, 209, 446, 428/448, 450, 447, 913; 174/52 FP, 68.5; 361/397

[56] References Cited

U.S. PATENT DOCUMENTS

| | | |
|---|---|---|
| 2,368,140 | 1/1945 | Johnson . |
| 2,477,203 | 2/1950 | Bennett . |
| 2,771,333 | 11/1956 | Eberle ............................ 312/31 |
| 2,994,404 | 8/1961 | Schifferly ..................... 206/524.2 |
| 3,260,234 | 7/1966 | Serrano et al. ................... 252/194 |
| 3,264,248 | 8/1966 | Lee ..................................... 260/30.6 |
| 3,326,810 | 6/1967 | Dolan ................................... 428/76 |
| 3,975,757 | 8/1976 | Sporck ................................. 357/72 |
| 4,079,511 | 3/1978 | Grabbe ................................ 29/627 |
| 4,081,397 | 3/1978 | Booe ................................... 252/194 |
| 4,163,072 | 7/1979 | Soos ...................................... 427/96 |
| 4,327,369 | 4/1982 | Kaplan ................................. 428/76 |
| 4,407,897 | 10/1983 | Farrell et al. ...................... 428/516 |
| 4,425,410 | 1/1984 | Farrell et al. ...................... 428/516 |
| 4,464,443 | 8/1984 | Farrell et al. ...................... 428/516 |
| 4,511,705 | 4/1985 | Makino et al. ....................... 528/26 |
| 4,542,260 | 9/1985 | Pearce ............................. 174/52 PE |
| 4,572,853 | 2/1986 | Ikeya et al. .......................... 428/76 |
| 4,576,841 | 3/1986 | Lingemann .......................... 428/76 |
| 4,595,616 | 6/1986 | Bell et al. ............................. 428/76 |
| 4,614,963 | 9/1986 | Brettle et al. ........................ 428/76 |
| 4,617,584 | 10/1986 | Ikeye et al. .......................... 428/76 |
| 4,792,484 | 12/1988 | Moritani ............................. 428/323 |

*Primary Examiner*—Edith Buffalow
*Attorney, Agent, or Firm*—Lorraine S. Melotik; Roger L. May

[57] ABSTRACT

This invention is directed to composite coating for maintaining low moisture levels at the surface of solid substrates. One embodiment of the invention comprises a coating a having a desiccant layer between layers of the same or different elastomeric polymers. Another embodiment comprises a layer of elastomeric polymer covered with a layer of an elastomeric polymer/desiccant mixture. The composite coating may be applied to integrated circuits to prevent corrosion thereof.

11 Claims, No Drawings

COMPOSITE POLYMER/DESICCANT COATINGS FOR IC ENCAPSULATION

BACKGROUND OF THE INVENTION

1. Field of the Invention

This invention is directed to a composite coating for maintaining low moisture levels at the surface of solid substrates. One embodiment of this composite coating comprises a layer of desiccant between two layers of the same or different elastomeric polymer. According to another embodiment of this invention, the coating comprises a layer of elastomeric polymer covered with a layer of an elastomeric polymer/desiccant mixture. The composite coating may be employed to encapsulate microelectronic integrated circuits (ICs) in order to inhibit moisture-related corrosion of the metal surface thereof.

2. Discussion of the Related Art

Micro-electronic circuits, such as thin film and hybrid integrated circuits, have found increasing use in sophisticated systems where it is necessary to assemble the circuits on printed wiring boards by various soldering techniques. The need for stable operating characteristics and increased operational life of such circuitry has necessitated an effort to provide the greatest possible protection of the circuitry from contaminants in the atmosphere. Hermetic sealing of the components is one way to provide a controlled environment in which the electronic device can function. Such protection generally involves vacuum packaging of the circuitry within ceramic or metal containers. However, a true and effective hermetic seal is difficult to achieve in all cases. Additionally, the hermetic container may contain water vapor and volatile components which, if not removed prior to closure, could affect the operation of the electronic component. In vacuum packaging of ICs, the IC surface does not contact the container and relies on a low moisture, vacuum environment surrounding the IC surface. This contrasts with plastic encapsulation, the other important method of isolating ICs from their surroundings. Plastic encapsulation comprises coating(s) applied over the IC surface directly.

Today a large proportion of ICs are protected from their surroundings via encapsulation in thermosetting or thermoplastic materials. Very often this is the only form in which some ICs are available. This situation has arisen because of the large demand for devices that comes from the consumer electronics industry which wishes to acquire its components at the lowest possible cost. Semiconductor devices encapsulated with resin compositions can advantageously be produced at low cost and on a large scale, as compared to those encapsulated with metals or ceramics. In contrast, however, resin encapsulants are generally inferior in humidity resistance and electrical properties, especially at high temperatures. For example, when an epoxy resin encapsulation-type semiconductor device is used at a high temperature and high humidity, electrical insulation of the semiconductor device may be lowered. This lowers the performance of the device by increasing leakage current or causing corrosion of aluminum electrodes or wiring, sometimes leading to the failure or breakdown of the wiring. One of the major failure mechanisms in thermoplastic and thermosetting material encapsulated devices is that of the corrosion of the microcircuit surface which is caused by the use of encapsulants which contain ionic impurities as additives and by-products from the manufacturer. The impurities can pick up moisture diffusing through the encapsulant and form an aggressive electrolytic solution. In the presence of a high bias voltage that is found between the conductors on the chip surface during operation, corrosion reactions occur which can rapidly cause device failure. Thus, as a result of the interaction between the moisture and the impurities existing within the encapsulating material, which is magnified at high temperatures, encapsulated ICs fail due to corrosion of aluminum metallization, wire bonds and the like.

Under certain very harsh operating conditions, e.g., in space or automotive applications, conventional thermoplastic or thermosetting material encapsulated devices are not as reliable as the more expensive hermetically sealed counterparts. This poses a particular problem for the automotive industry which requires devices that are capable of giving the utmost reliability while being of low cost. For example, it would be highly desirable if a low cost encapsulant could be found to protect the circuitry used in the harsh environment in the engine-compartment, which encapsulant would prevent moisture from reaching the circuit surface where it interacts with surface impurities to cause corrosion failure of the component.

A number of encapsulant coatings have been developed for ICs. For example, U.S. Pat. Nos. 4,079,511 and 4,511,705 teach the use of silicone resins as encapsulants for electronic circuits to avoid the penetration of moisture or gas. U.S. Pat. Nos. 3,264,248, 3,975,757, 4,327,369, 4,572,853, 4,614,963 and 4,617,584 are exemplary of patents which disclose the use of epoxy resins for encapsulating integrated circuits. In some of these patents, the epoxy encapsulant is taught to have special properties due to particular compounds incorporated therein. For example, the epoxy resin of '248 above is taught to be fire retardant due to the incorporation of phosphate compounds. In '853 above, the incorporation of organic phosphine compounds is taught to improve the moisture resistance of the epoxy resin. The addition of p-cresol to the resin of '963 above is taught therein to improve the corrosion inhibiting properties of the encapsulant resin. Still other patents, U.S. Pat. Nos. 4,163,072 and 4,542,260 teach a layered composite encapsulant of silicone/epoxy resins. In '072 above, the resin layers are cured together, the composite being described therein as thus having both moisture resistance and solvent resistance due to the silicone and epoxy, respectively.

As mentioned above, surface water and surface impurities do not operate independently. A threshold water content is involved, above which solid surface impurities dissolve to form aggressive electrolytic solutions. Corrosion rates increase many times at this threshold, which varies with the chemical form of the impurity. From the standpoint of low corrosion failure rates, it is clearly advantageous to operate devices with low-impurity and low-moisture content. Even in the vacuum packaging of ICs, attempts have been made to reduce surface moisture content. For example, Booe, in U.S. Pat. No. 4,081,397, teaches incorporation of a hygroscopic desiccant comprising alkaline earth oxides admixed with polymer which may be adhered to the inner wall of the container. This desiccant attempts to reduce the ICs' surface moisture without touching the IC surface directly.

The present invention provides a new means of achieving low humidity at a surface of a solid substrate by employing a novel composite coating thereon. While the usefulness of the present invention composite coating is directed primarily to microelectronic devices, the composite coating of this invention is useful in other systems subject to corrosion failure due to the presence of surface moisture, e.g., water pipes.

SUMMARY OF THE INVENTION

This invention is directed to a composite coating useful to maintain low moisture levels at the surface of solid substrates. The coating of this invention is useful, for example, to inhibit corrosion of a corrodible metal substrate. One embodiment of the invention comprises a composite coating of three layers. The first layer is a substantially continuous layer comprising a first elastomeric polymer formed on the substrate in a thickness of at least about 0.1 millimeter, the first elastomeric polymer being substantially non-reactive with the substrate. The second layer comprises desiccant formed on the first layer. If the desiccant is a hygroscopic salt a saturated solution of the hygroscopic salt corresponds to a relative humidity of less than about 50 percent. The second layer may comprise a mixture of an elastomeric polymer and the desiccant. The third layer is a substantially continuous layer formed on the second layer and comprises a second polymeric material having a low-water permeability. According to a second embodiment, the composite coating of this invention comprises two layers. In this second embodiment, the first layer is a substantially continuous layer comprising the first elastomeric polymer and the second layer is a substantially continuous layer comprising a mixture of the desiccant and the second elastomeric polymer. If the composite coating of this invention is employed to encapsulate microelectronic integrated circuitry, preferably the first elastomeric polymer is electronically non-conductive, more particularly this polymer is polysiloxane elastomer. This invention is also directed to a method for inhibiting corrosion by means of the composite coating defined above.

Advantageously, the present invention provides an inexpensive way of protecting integrated circuit components from contaminants in the atmosphere, even at the high temperatures to which such circuitry might be exposed if the device comprising the circuit components were to be used in the engine compartment of an automobile. We have found that the inner layer is sufficient to keep desiccant, and desiccant solutions separate from the IC surface.

DETAILED DESCRIPTION OF THE PREFERRED EMBODIMENTS

The composite coating of this invention is useful to maintain low moisture levels at the surface of solid substrates far below moisture levels corresponding to thermodynamic equilibrium. A coating of this invention is useful, for example, to inhibit corrosion of corrodible metal substrates. One embodiment of the invention comprises a composite coating of three layers, the second layer comprising desiccant between a first substantially continuous layer (on the substrate) and a third substantially continuous layer of the same or different elastomeric polymers. The second layer may comprise a mixture of the desiccant and the first elastomeric polymer. A second embodiment of this invention comprises a composite coating of two layers, the first layer being a substantially continuous layer comprising the first elastomeric polymer and the second layer being a substantially continuous layer comprising a mixture of the desiccant and the second elastomeric polymer. Each of these layers will be discussed in detail below.

In the first and the second embodiments of this invention as discussed above, the first layer of the composite coating is a substantially continuous layer present on the substrate in a thickness of at least about 0.1 millimeter. A thickness of between about 1 and 10 mm will generally be used if the composite coating is to be employed on integrated circuitry. The optimal thickness would depend, e.g., on the substrate to be coated by means of this invention, the elastomeric polymer employed and the environmental conditions to which the coated substrate is to be subjected during its use. The first elastomeric polymer may be any elastomeric polymer which is substantially non-reactive with the metal substrate. In an embodiment wherein the composite coating is employed on semi-conductor devices, including integrated circuits, transistors, diodes and the like, the first elastomeric polymer may be selected from numerous well known and commercially available polymers useful for sealing such devices. Exemplary of such first elastomeric polymers are silicone elastomers, epoxy resins, vinyl plastisols, polyurethane rubbers, and the like. The silicone elastomers, e.g., polysiloxane, are preferred for use in this invention. The first elastomeric polymer component may also be a mixture of compatible suitable elastomers. The first elastomeric polymer must have sufficiently good adhesion to metal and be sufficiently flexible to allow the first elastomeric polymer to maintain its integrity (i.e., bond) with the substrate, even if the substrate is subjected to mechanical shock. Exemplary of such elastomers are those described in the aforementioned U. S. Patents as well as U.S. Pat. No. 4,081,397, which patents are expressly incorporated by reference herein for such teachings. Commercially available polysiloxanes include, for example, those marketed as the Amicon (trademark) series by W.R. Grace Co., Lexington, Mass., e.g., Amicon SC-120-8 and SC-130-4 and as the HIPEC (trademark) series by Dow Corning, Midland, MI, e.g., HIPEC-643 and HIPEC-3-6550. Exemplary of suitable commercially available epoxies are those marketed bY Hysol, a division of Dexter Corp., Industry, CA., e.g., ES 4128, MH 19F and MG 20F. Still other suitable commercially available elastomers useful in this invention will be apparent to those skilled in the art in view of the present disclosure. When the composite coating of this invention is employed as an encapsulant for ICs, the first elastomeric polymer is preferably a polysiloxane compound. Selection of the optimal thickness of this first layer and selection of the first elastomeric polymer will be apparent to one skilled in the art in view of the present disclosure.

The first elastomeric polymer may be applied to the substrate by any available method, e.g., by injection molding, spin coating, or potting the monomer or prepolymer. Generally, prior to applying such a first layer, the substrate surface would be cleaned, particularly if the substrate is an IC. Standard cleaning procedures for ICs generally include a cleaning with hydrocarbon vapors such as methanol, isopropanol and the like. As would be apparent to one skilled in the art in view of the present disclosure, the method and necessity of cleaning the substrate would be dependent on factors including the type of substrate and the type and amount of contamination present on the substrate surface to be coated according to this invention.

In the first embodiment of this invention as discussed above, the second layer of the composite coating comprises desiccant which is applied to (i.e., on top of) the first layer comprising a first elastomeric polymer. Exemplary of suitable desiccants are silica gel, activated alumina, anhydrous calcium sulfate, magnesium perchlorate and hygroscopic salts. The hygroscopic salts are selected from hygroscopic salts wherein a saturated solution thereof corresponds to a relative humidity of less than about 50 percent, more preferably between about 0 and about 30 percent. As is known in the art, the relative humidity of a hygroscopic salt can be calculated using the formula $[RH] = \exp(-Ym\phi/55.5)$ where m is the molality of a saturated solution, $\phi$ is the osmotic coefficient, and Y is the number of ions formed when the salt dissociates. Discussions of RH may be found in R.A. Robinson and, R. H. Stokes, *Electrolytic Solutions* [Academic Press, N. Y. 1959]pp. 24–30. Exemplary of such salts are calcium chloride, sodium acetate, lithium chloride and magnesium nitrate and their salt hydrates. The desiccant component may comprise one such desiccant or a mixture of such desiccants. In this first embodiment of the invention coating, the desiccant layer may be a substantially continuous or discontinuous layer of desiccant granules. Preferably this layer is substantially continuous, containing granules that touch one another. Typically, the granule size is about 60 mesh for ICs. Preferably for ICs, the desiccant is present in the second layer in a density of about 0.003 g/cm$^2$. The desiccant layer may be applied by to the first layer by, e.g., sprinkling the desiccant on the first layer in a desired density. Alternately, the second layer in this first embodiment of the invention may comprise a mixture of the desiccant and an elastomeric polymer, such as those suitable as the first elastomeric polymer. Use of a desiccant/polymer mixture as the second layer of the first embodiment of this invention would advantageously provide for ease of application of the desiccant. Still further, use of a desiccant/polymer mixture as the second layer would allow for the desiccant to be more homogeneously distributed.

The third layer which covers the second layer in the first embodiment of the invention, comprises second elastomeric polymer which has a low permeability to water. This second elastomeric polymer may be selected from those disclosed above as the first elastomeric polymer. Preferably, the second elastomeric polymer is a polysiloxane. This second elastomeric polymer preferably has a water permeability of less than 0.1 mg-mm/cm$^2$-day. The third (top) layer can be applied by a variety of methods including potting, injection molding and the like.

In the second embodiment of this invention, the second layer comprises a substantially continuous layer of a mixture of the desiccant and the second elastomeric polymer. The use of a second (mixture) layer allows for a more convenient way of forming the composite coating, i.e., in two layers rather than in three. This second layer, which is a desiccant/second polymer mixture, performs the same function as the combination of the second and third layers of the first embodiment of the invention discussed above, i.e., it inhibits penetration of moisture from outside the coating and keeps that which does penetrate through absorbed on the salt and away from the substrate surface.

The invention will be further understood by referring to the following detailed examples. It should be understood that the specific examples are presented by way of illustration and not by way of limitation.

The test specimens used in the following examples were prepared by photolithography at the Ford Research IC Facility. Each specimen contained two pairs of interdigitated combs of metallized Al on a SiO$_2$ film, 10 $\mu$m thick, formed on a Si substrate. Each comb consisted of ten Al strips, 6600 $\mu$m long, 140 $\mu$m wide, 1 82 m thick, separated by 114 $\mu$m. Specimens were mounted on a commercially available gold plated platform package with electronic grade epoxy cement. Electrical connections between combs and platform pins were made by thermosonic ball bonding with 25 $\mu$m diameter gold wire. Specimens were cleaned in methanol and its vapor, with subsequent drying in an oven at 120° C.

Corrosion performance testing of IC polymer encapsulants typically involves encapsulating interdigitated comb test specimens with the polymer under test. One then measures the leakage current between anode and cathode when the combs are connected to a battery. With typical comb metallization, leakage currents less than 1 PA (picoamperes $= 10^{-12}$ amperes) are indicative of good encapsulation; leakage currents greater than 10 na (nanoamperes $= 10^{-9}$ amperers), of poor encapsulation. The leakage current varies with the water content of the encapsulant, which increases with external relative humidity. The relative leakage currents of a given encapsulated comb under different environmental conditions can be used to estimate device lifetime.

EXAMPLE 1

The surface of each of two identical IC test specimens (2 square centimeters in area) was cleaned thoroughly to minimize residual ionic surface contamination. The specimens were then coated with a surface-layer of polysiloxane encapsulant (Amicon SC-120-8, trademark), evacuated under decreased pressure to remove air and cured at 150° C. to form a first layer on the specimens 0.5 cm thick. A second layer of granular CaCl$_2$, having a weight of 0.4 gm, was applied over the surface layer on one of the test-specimens. No CaCl$_2$ was applied to the other specimen. Finally, an outer layer of polysiloxane encapsulant, 0.5 cm thick, was applied to both specimens.

Both specimens were placed in an environmental chamber at <1% measured relative- humidity and 20° C. Following an one-hour equilibration period, experimentally-indistinguishable leakage currents of 8–10 pA were measured on both specimens. These small values are typical for test-specimens under dry conditions.

Subsequently, the relative humidity was increased to >99% [20° C.]. After one-hour equilibration, the specimen without CaCl$_2$ exhibited a steady 85–95 pA leakage current: This value is typical of clean; i.e., low-surface-impurity specimens at 90–100% relative humidity. In contrast to this behavior, measurements on the specimen containing CaCl$_2$ exhibited a much lower, steady, leakage current of 8–12 pA. This value matched previous results on encapsulated test-specimens equilibrated in a gaseous environment at 29% relative humidity, the equilibrium water vapor pressure of a CaCl$_2$ saturated solution at 20° C. Experimental leakage currents on both specimens were constant over a five-hour period.

Finally, the environmental chamber again was adjusted to <1% relative humidity. After a one-hour equilibration time, 8-10 pA leakage currents were again measured on both specimens. This demonstrated experimental reversibility.

This experiment teaches that, under high external humidity conditions, the clean specimen encapsulated with a hygroscopic $CaCl_2$ layer maintained leakage current far below the value measured for a clean specimen encapsulated without $CaCl_2$.

EXAMPLE 2

Additional experiments were performed using the procedure described above, starting with surface-cleaned comb-specimens and with another chemical replacing $CaCl_2$ in the interfacial encapsulant layer: specifically NaCl, $Mg(NO_3)_2$ and sodium acetate were used individually in amounts of about 0.006 gm.

Control specimens, prepared without any interfacial material, showed experimental results that conformed to those described above; i.e., leakage currents of 8-12 pA and 85-95 pA at <1% and >99% relative humidity respectively.

At <1% external relative humidity, encapsulated comb specimens with a interfacial layer containing NaCl, $Mg(NO_3)_2$ or sodium acetate exhibited 8-12 pA leakage currents. At >99% external relative humidity, the following leakage currents were measured: 15-25 pA [NaCl]; 10-15 pA [$Mg(NO_3)_2$]; 45-60 pA [sodium acetate]. These values matched previous experimental leakage currents for surface-cleaned, encapsulated specimens equilibrated in gaseous environments at 76%, 40% and 95% relative humidity respectively. These humidities correspond to the [20° C.]water vapor pressures over saturated solutions of NaCl, $Mg(NO_3)_2$ and sodium acetate respectively.

These experiments teach that the saturatedsolution relative humidity dictated the leakage current of specimens encapsulated with an interfacial layer of chemicals.

EXAMPLE 3

Another experiment was performed using the procedure of Example 1. In this test, the surfaces of both test-specimens were deliberately contaminated by evaporation of an aqueous droplet containing 0.01 M NaCl prior to the application of the polysiloxane surface coating. One test-specimen was prepared with an interfacial $CaCl_2$ layer (0.07 gm); a second specimen was prepared without an interfacial layer.

Both specimens exhibited 8-12 pA leakage currents after equilibration at <1% relative humidity. After equilibration at >99% relative humidity, a 10 $\mu$A leakage current was measured on the specimen prepared without $CaCl_2$. This large current resulted in massive deterioration of the aluminum metallization which could be seen visually through a microscope. In marked contrast, the specimen prepared with interfacial $CaCl_2$ continued to exhibit a 10-15 pA leakage current when equilibrated at >99% relative humidity.

This experiment taught that water-content reduction produced by the interfacial $CaCl_2$ layer is sufficient to reduce the large leakage currents generated by surface impurities.

EXAMPLE 4

Two identical test IC specimens were cleaned and coated as in Example 1 with polysiloxane in a thickness of 0.4 cm. A mixture of polysiloxane (20g) and powdered $CaCl_2$ (2g) was prepared and applied as a coating to one of the specimens in a thickness of 0.5 cm.

The control specimen, i.e., the one without the mixture layer containing $CaCl_2$, showed a leakage current of 8-12 pa and 80-100 pa at 1% and 90% relative humidity, respectively. The specimen containing the second layer (i.e., the mixture of polysiloxane and $CaCl_2$ showed a leakage current of 8-10 pA at a relative humidity <1% and a leakage current of 8-12 pA at a relative humidity of >99%.

This experiment teaches that under high relative humidity conditions the specimen encapsulated with the $CaCl_2$ particles dispersed in the second layer maintainted a leakage current far below the value measured for a specimen encapsulated without $CaCl_2$.

In view of this disclosure, many modifications of this invention will be apparent to those skilled in the art. It is intended that all such modifications which fall within the true scope of this invention be included with the terms of the appended claims.

We claim:

1. A composite coating for maintaining low moisture levels at the surface of solid substrates, which composite coating comprises:
   a substantially continuous first layer comprising first elastomeric polymer on said substrate, said first elastomeric polymer being substantially non-reactive with said substrate and being present in a thickness of at least about 0.1 millimeter;
   a substantially continuous second layer disposed on said first layer and comprising desiccant; and
   a substantially continuous third layer covering said second layer and comprising second elastomeric polymer having low permeability to water.

2. A composite coating according to claim 1, wherein said first elastomeric polymer is selected from the group consisting of: silicone elastomers, epoxy resins, vinyl plastisols and polyurethane.

3. The composite coating according to claim 1, said first layer is present in a thickness between about 0.1 and about 10 millimeters.

4. The composite coating according to claim 1, wherein said first elastomeric polymer is substantially non-electronically conductive.

5. The composite coating according to claim 1, wherein said desiccant is selected from the group consisting of silica gel, activated alumina, anhydrous calcium sulfate, magnesium perchlorate and hygroscopic salts, wherein a saturated solution of said hygroscopic material corresponds to a relative humidity of less than about 50 percent.

6. The composite coating according to claim 5, wherein said hygroscopic salts are selected from the group consisting of: calcium chloride, magnesium nitrate, sodium acetate, and lithium chloride and their salt hydrates.

7. The composite coating according to claim 5, wherein a saturated solution of said salt hygroscopic salt corresponds to a relative humidity between about 10 and about 30 percent.

8. The composite coating according to claim 1, wherein said second layer comprises a mixture of said desiccant and said first elastomeric polymer.

9. The composite coating according to claim 1, wherein said second elastomeric polymer is selected from the group consisting essentially of polysiloxane, polyurethane rubbers, epoxy resins and vinyl plastisols.

10. The composite coating according to claim 1, wherein said second elastomeric polymer has a water permeability of less than 0.1 mg-mm/cm-day.

11. The composite coating according to claim 1, wherein said second layer comprises a mixture of said desiccant and said second elastomeric polymer.

* * * * *